United States Patent
McEwen-King (10) Patent No.: US 9,423,523 B2
(45) Date of Patent: Aug. 23, 2016

(54) PORTAL MONITORING

(75) Inventor: Magnus McEwen-King, Farnborough (GB)

(73) Assignee: Optasense Holdings Limited (GB)

(*) Notice: Subject to any disclaimer, the term of this patent is extended or adjusted under 35 U.S.C. 154(b) by 46 days.

(21) Appl. No.: 14/232,793

(22) PCT Filed: Jul. 12, 2012

(86) PCT No.: PCT/GB2012/051650
§ 371 (c)(1),
(2), (4) Date: Jan. 14, 2014

(87) PCT Pub. No.: WO2013/011282
PCT Pub. Date: Jan. 24, 2013

(65) Prior Publication Data
US 2014/0159715 A1    Jun. 12, 2014

(30) Foreign Application Priority Data
Jul. 15, 2011 (GB) .................... 1112161.3

(51) Int. Cl.
*G01V 3/08* (2006.01)
*G01R 33/032* (2006.01)

(52) U.S. Cl.
CPC ............ *G01V 3/08* (2013.01); *G01R 33/032* (2013.01); *G01R 33/0327* (2013.01)

(58) Field of Classification Search
None
See application file for complete search history.

(56) References Cited

U.S. PATENT DOCUMENTS

| | | | | | |
|---|---|---|---|---|---|
| 3,806,908 A | * | 4/1974 | Bound | .................... | G01V 1/201 340/525 |
| 3,832,704 A | * | 8/1974 | Kardashian | ............. | G01L 1/125 174/126.2 |
| 3,833,897 A | * | 9/1974 | Bell | .................... | G08B 13/169 367/136 |
| 3,882,441 A | * | 5/1975 | Holmen | ................. | G08B 13/10 174/126.2 |
| 4,144,530 A | * | 3/1979 | Redfern | ............... | G02B 6/4416 174/70 R |
| 4,376,248 A | * | 3/1983 | Giallorenzi | ............ | G01R 33/02 250/227.19 |
| 4,378,497 A | * | 3/1983 | Giallorenzi | ........ | G01R 33/0327 250/227.19 |
| 4,433,291 A | * | 2/1984 | Yariv | ................. | G01R 33/0327 250/227.19 |
| 4,442,350 A | * | 4/1984 | Rashleigh | .............. | G01H 9/004 250/227.17 |
| 4,471,219 A | * | 9/1984 | Giallorenzi | ............ | G02B 6/283 250/227.14 |
| 4,538,140 A | * | 8/1985 | Prestel | ................. | G08B 13/126 340/556 |
| 4,545,253 A | * | 10/1985 | Avicola | .............. | G01D 5/35383 250/227.14 |

(Continued)

FOREIGN PATENT DOCUMENTS

GB     2442745     4/2008

*Primary Examiner* — Jermele M Hollington
*Assistant Examiner* — Suresh K Rajaputra
(74) *Attorney, Agent, or Firm* — McDonnell Boehnen Hulbert & Berghoff LLP (57) ABSTRACT

The present invention relates to a portal monitoring system that uses distributed sensing to detect metallic objects passing through the portal. The system comprises a length of fiber optic (102) comprising an optical fiber (106) mechanically coupled to a material (108) whose physical characteristics vary dependent on the applied magnetic field. The fiber optic (102) is arranged in the vicinity of a portal (200) and a fiber optic interrogator (104) is adapted to provide distributed sensing on the optical fiber to provide measurement data from a plurality of contiguous portions of said optical fiber at each of a plurality of times. A data analyzer processes the measurement data to detect signals characteristic of a disturbance in the magnetic field along the optical fiber. The system of the present invention is able to monitor multiple people passing though a portal at the same time and provide an indication of the location of metallic objects within the portal.

26 Claims, 3 Drawing Sheets

(56) References Cited

U.S. PATENT DOCUMENTS

| | | | | |
|---|---|---|---|---|
| 4,591,786 A * | 5/1986 | Koo | G01R 33/0327 | 324/244.1 |
| 4,603,296 A * | 7/1986 | Koo | G01R 33/0327 | 250/227.19 |
| 4,607,162 A * | 8/1986 | Sai | G01D 5/268 | 250/227.21 |
| 4,609,871 A * | 9/1986 | Bobb | G02B 6/4457 | 250/227.19 |
| 4,634,977 A * | 1/1987 | Lenz | G01R 33/0327 | 324/244.1 |
| 4,650,281 A * | 3/1987 | Jaege | G01R 33/0327 | 324/244 |
| 4,749,246 A * | 6/1988 | Epworth | G01D 5/35383 | 250/227.14 |
| 4,918,371 A * | 4/1990 | Bobb | G01R 15/248 | 250/227.19 |
| 4,931,771 A * | 6/1990 | Kahn | G02B 6/4469 | 250/227.14 |
| 5,059,783 A * | 10/1991 | Stranjord | H03K 17/95 | 250/227.19 |
| 5,194,847 A * | 3/1993 | Taylor | G01H 9/004 | 340/541 |
| 5,243,403 A * | 9/1993 | Koo | G01R 33/0327 | 250/227.19 |
| 5,394,488 A * | 2/1995 | Fernald | G01H 9/004 | 250/227.18 |
| 5,448,222 A * | 9/1995 | Harman | G08B 13/2497 | 340/566 |
| 5,471,139 A * | 11/1995 | Zadoff | G01R 33/0327 | 250/227.14 |
| 5,680,489 A * | 10/1997 | Kersey | G01D 5/35383 | 356/35.5 |
| 5,748,312 A * | 5/1998 | Kersey | G01L 1/246 | 250/227.23 |
| 5,757,487 A * | 5/1998 | Kersey | G01D 5/35383 | 356/478 |
| 5,781,677 A * | 7/1998 | Jin | G02B 6/022 | 385/37 |
| 5,792,284 A * | 8/1998 | Cedell | B29C 70/58 | 148/101 |
| 5,812,711 A * | 9/1998 | Glass | G02B 6/022 | 385/12 |
| 6,127,926 A * | 10/2000 | Dando | G08B 13/2491 | 340/522 |
| 6,144,790 A * | 11/2000 | Bledin | G01H 9/004 | 385/121 |
| 6,223,066 B1 * | 4/2001 | Govari | G01R 33/032 | 600/424 |
| 6,233,746 B1 * | 5/2001 | Skinner | E21B 47/06 | 250/227.18 |
| 6,252,656 B1 * | 6/2001 | Wu | G01V 1/22 | 356/73.1 |
| 6,433,543 B1 * | 8/2002 | Shahinpoor | G01R 33/0327 | 324/244.1 |
| 6,463,186 B1 * | 10/2002 | Li | G02F 1/0128 | 356/450 |
| 6,483,309 B1 * | 11/2002 | Gripshover | G01R 29/0814 | 324/117 R |
| 6,522,797 B1 * | 2/2003 | Siems | G01H 3/005 | 250/227.14 |
| 6,594,290 B2 * | 7/2003 | Toida | G01H 9/00 | 372/28 |
| 6,854,327 B2 * | 2/2005 | Rambow | G01B 11/18 | 324/96 |
| 6,934,426 B2 * | 8/2005 | Rich | G02B 6/4469 | 385/102 |
| 6,937,151 B1 * | 8/2005 | Tapanes | G08B 13/124 | 250/227.19 |
| 7,064,315 B2 * | 6/2006 | Kraemmer | G01R 15/24 | 250/227.14 |
| 7,096,148 B2 * | 8/2006 | Anderson | A61B 5/06 | 324/207.17 |
| 7,127,132 B1 * | 10/2006 | Moslehi | G01D 5/35303 | 385/12 |
| 7,135,970 B2 * | 11/2006 | Kowal | G08B 13/186 | 340/555 |
| 7,139,476 B2 * | 11/2006 | Patel | H04B 10/00 | 398/16 |
| 7,154,081 B1 * | 12/2006 | Friedersdorf | G01B 11/18 | 250/227.14 |
| 7,174,201 B2 * | 2/2007 | Govari | A61B 5/06 | 382/124 |
| 7,184,907 B2 * | 2/2007 | Chun | G08B 13/186 | 702/69 |
| 7,196,318 B2 * | 3/2007 | Shin | A61B 5/01 | 250/227.14 |
| 7,239,400 B2 * | 7/2007 | Bock | G01R 33/287 | 356/364 |
| 7,248,204 B2 * | 7/2007 | Lovberg | G01V 8/005 | 342/179 |
| 7,384,211 B2 * | 6/2008 | Wong | E01F 13/12 | 256/1 |
| 7,402,790 B2 * | 7/2008 | Browning, Jr. | G02B 6/4469 | 250/221 |
| 7,466,228 B2 * | 12/2008 | Wong | E01F 13/12 | 340/541 |
| 7,488,929 B2 * | 2/2009 | Townley-Smith | G08B 13/124 | 250/227.14 |
| 7,519,242 B2 * | 4/2009 | Tapanes | G08B 13/10 | 356/477 |
| 7,542,856 B2 * | 6/2009 | Kishida | G01B 11/16 | 702/35 |
| 7,558,155 B2 * | 7/2009 | Ronnekleiv | G01V 1/20 | 181/110 |
| 7,646,944 B2 * | 1/2010 | Kaplan | G01M 11/083 | 340/541 |
| 7,649,350 B2 * | 1/2010 | Heyden | B61L 1/165 | 246/202 |
| 7,679,994 B2 * | 3/2010 | Ronnekleiv | G01D 5/35383 | 181/110 |
| 7,688,673 B2 * | 3/2010 | Ronnekleiv | G01D 5/35383 | 181/102 |
| 7,835,779 B2 * | 11/2010 | Anderson | A61B 5/06 | 600/407 |
| 7,844,178 B1 * | 11/2010 | Eslambolchi | G08B 13/186 | 385/12 |
| 7,852,213 B2 * | 12/2010 | Browning, Jr. | G08B 13/186 | 250/227.14 |
| 7,956,316 B2 * | 6/2011 | Browning, Jr. | G08B 13/186 | 250/221 |
| 7,965,909 B2 * | 6/2011 | Hill | G01D 5/35303 | 385/12 |
| 8,035,393 B2 * | 10/2011 | Tenghamn | G01V 3/083 | 324/347 |
| 8,058,869 B2 * | 11/2011 | Cranch | A01D 89/008 | 324/244.1 |
| 8,111,584 B1 * | 2/2012 | Langston | G01R 33/0327 | 367/128 |
| 8,125,644 B2 * | 2/2012 | Crowe | G01R 33/032 | 324/244.1 |
| 8,200,049 B2 * | 6/2012 | Kaplan | G01M 5/0091 | 250/227.11 |
| 8,537,011 B2 * | 9/2013 | Iffergan | F41H 11/05 | 340/541 |
| 8,537,345 B2 * | 9/2013 | Crickmore | G01H 9/004 | 356/73.1 |
| 8,564,786 B2 * | 10/2013 | Crickmore | G01D 5/35303 | 356/477 |
| 8,661,907 B2 * | 3/2014 | Davis | G01D 5/35383 | 73/643 |
| 8,755,643 B2 * | 6/2014 | Nash | G01D 5/35383 | 385/12 |
| 8,776,465 B2 * | 7/2014 | Murphy | E04F 19/00 | 52/309.4 |
| 8,797,824 B2 * | 8/2014 | Crickmore | G01V 1/24 | 356/73.1 |
| 8,923,663 B2 * | 12/2014 | Hill | G01D 5/353 | 385/12 |
| 8,928,480 B2 * | 1/2015 | Iffergan | B63G 9/04 | 340/501 |
| 8,950,482 B2 * | 2/2015 | Hill | E21B 43/11857 | 166/177.5 |

(56) References Cited

U.S. PATENT DOCUMENTS

| | | | |
|---|---|---|---|
| 8,973,444 B2* | 3/2015 | Hill | F17D 5/06 73/623 |
| 2005/0024208 A1* | 2/2005 | Maki | G08B 13/2497 340/545.3 |
| 2005/0093733 A1 | 5/2005 | Lovberg et al. | |
| 2008/0094212 A1* | 4/2008 | Breed | G08B 13/2491 340/541 |
| 2010/0316328 A1* | 12/2010 | Arias Vidal | G01D 5/485 385/12 |
| 2012/0222487 A1* | 9/2012 | Hill | G01D 5/3538 73/655 |
| 2012/0226452 A1* | 9/2012 | Hill | G01H 9/004 702/56 |
| 2012/0230629 A1* | 9/2012 | Hill | G01D 5/35361 385/12 |
| 2013/0154632 A1* | 6/2013 | McEwen-King | G02B 6/4401 324/244.1 |
| 2013/0233537 A1* | 9/2013 | McEwen-King | E21B 43/26 166/250.1 |

* cited by examiner

PORTAL MONITORING

FIELD OF THE INVENTION

The present invention relates to portal monitoring, in particular, it relates to electromagnetic field monitoring in a portal using distributed sensing.

BACKGROUND OF THE INVENTION

The ability to scan people, luggage, cargo etc. for the presence of metallic objects is becoming ever more important, in particular at airports and other locations with restricted access.

Conventional metal detectors are based on pulse induction (PI). Typical PI systems use a coil of wire on one side of a portal (usually an arch) as the transmitter and receiver. Short bursts (pulses) of current are sent through the coil of wire, each pulse generating a brief magnetic field. When a pulse ends, the magnetic field reverses polarity and collapses causing a current to run through the coil. If a metallic object passes through the metal detector, a magnetic field is induced in the metallic object, and this magnetic field interferes with the current generated in the coil. By monitoring the generated current, the metal detector can determine if a metallic object is present.

Such systems can typically only detect that a metallic object is present and don't usually give any indication as to where the object may be located. One disadvantage of this system is thus that it is generally necessary to scan a single individual at any one time. This is because if two people were to be scanned at the same time, it would not be possible to determine who was carrying the metallic object. This can mean that such systems are not suitable for some applications, such as at railway and subway stations or other mass transit hubs, as to provide the desired throughput of individuals would require an impractical number of portals and associated screening staff.

It is therefore desirable to provide a monitoring system that is able to scan multiple objects at a time, while still accurately being able to detect metallic objects, in order to increase throughput at security checkpoints. It is further desirable to provide a monitoring system that can provide an indication as to the location of a detected metallic object.

SUMMARY OF THE INVENTION

Embodiments of the present invention aim to address at least some of the above problems to some extent.

According to an aspect of the present invention there is provided a portal monitoring system comprising: a first length of optical fibre mechanically coupled to a material whose physical characteristics vary dependent on the ambient magnetic field, the optical fibre being arranged in the vicinity of a portal; a fibre optic interrogator adapted to provide distributed sensing on the optical fibre to provide measurement data from a plurality of sensing portions of said optical fibre at each of a plurality of times; and a data analyser adapted to process said measurement data to detect signals characteristic of a disturbance in the magnetic field along the optical fibre.

As will be described in more detail below distributed acoustic sensing is a known technique wherein one or more interrogation pulses are used to interrogate an optical fibre and the radiation backscattered from the fibre is detected. Mechanical disturbances of the fibre result in changes in the characteristics of backscattered radiation from the relevant section of fibre. These changes in backscatter can be used to give an indication of the intensity of the disturbance and, using optical time domain reflectometry type techniques, the position in the fibre can also be determined. In a distributed acoustic sensor the disturbances, may, for instance, be due to incident pressure waves. By coupling an optical fibre to a material whose physical characteristics, e.g. dimensions, vary dependent on the applied magnetic field, disturbances in a magnetic field can lead to corresponding disturbances, e.g. change in strain, on the optical fibre and thus can be detected reliably using the principles of distributed acoustic sensing. The terms distributed acoustic sensor shall therefore be used to refer to a sensor that detects local disturbances of the fibre by analysing the backscattered radiation and shall be taken to include distributed optical fibre vibration sensors or distributed optical fibre strain sensors.

In general, in a magnetic field, a strain (or in fact $1^{st}$ and $2^{nd}$ time differentials of local strain) is created in an optical fibre by coupling it mechanically to a material that is affected by changes in a magnetic field, particularly a material whose dimensions are changed when the magnetic field varies. Advantageously this should be one whose dimensions change anisotropically, so that flux in one dimension only may be selectively be detected.

The fibre optic interrogator may be arranged to provide measurement signals from a plurality of contiguous sensing portions of optical fibre substantially simultaneously. The system may comprise a sampler arranged to sample a plurality of data channels (corresponding to detected backscatter from different portions of the optical fibre) substantially simultaneously to provide the measurement data.

The optical fibre may be deployed, e.g. wrapped, around at least two sides of the portal. The optical fibre may be coiled around the portal.

The portal may have a length of 2 meters or more. Thus the portal may define a corridor. The optical fibre may be coiled along the length of the portal.

The data analyzer may be arranged to determine the location of a detected magnetic field disturbance along the optical fibre. The data analyzer may be arranged to monitor the location of a detected magnetic field disturbance as it moves along the portal.

The length of the optical fibre may be several km or more. For instance the length of the optical fibre may be of the order of 40 km.

The system may further comprise a magnetic field generator arranged to generate a magnetic field in the vicinity of the portal. The data analyzer may be arranged to compensate for signals associated with the generated magnetic field itself (i.e. the directly generated field—thus allowing detection of any induced fields in magnetic objects). The generated magnetic field may be a constant magnetic field. Alternatively, the generated magnetic field may be a time varying magnetic field.

The system may also comprise a second length of optical fibre deployed along the same path as the first length of optical fibre, wherein the second length of optical fibre is substantially insensitive to changes in magnetic field and a fibre optic interrogator may be arranged to interrogate said second length of optical fibre to detect any acoustic signals affecting the second length of optical fibre. The data analyser may be arranged to process the detected signals from the second length of optical fibre to compensate for any acoustic signals affecting the first optical fibre. The second optical fibre may be interrogated by the same fibre optic interrogator as the first optical fibre or there may be separate interrogators for each optical fibre.

The portal may be arranged along a corridor of a building.

The portal may be arranged to be a free standing portal.

According to another aspect of the present invention, there is provided a method of portal monitoring, the method comprising: interrogating an optical fibre, which is mechanically coupled to a material whose physical characteristics vary dependent on the ambient magnetic field, with pulses of electromagnetic radiation to provide a distributed sensor having a plurality of sensing portions of optical fibre, said optical fibre being arranged around at least two sides of a portal, and analysing the signals from said sensing portions of optical fibre to detect signals characteristic of disturbance in the magnetic field in the portal.

The optical fibre may be coiled along the length of the portal The location of the detected disturbance along the fibre may correspond to the position of the source of the disturbance of magnetic field, e.g. the location of a metallic object, along the length of the portal.

The method may further comprise monitoring the location of a detected disturbance in magnetic field as moving along the portal.

The method may further comprise generating a magnetic field in the vicinity of the portal. The magnetic field may be constant or time-varying.

The portal may be arranged along a corridor of a building. The optical fibre may be installed during the construction of the corridor. The portal may be retrofitted to the corridor.

The invention also provides a portal monitoring system comprising: a first length of optical fibre mechanically coupled to a material whose physical characteristics vary dependent on the ambient magnetic field, the optical fibre being arranged in the vicinity of a portal; a fibre optic interrogator adapted to provide distributed sensing on the optical fibre to provide measurement data from a plurality of sensing portions of said optical fibre at each of a plurality of times; and a data analyser adapted to process said measurement data to detect signals characteristic of a disturbance in the magnetic field along the optical fibre.

DESCRIPTION OF THE DRAWINGS

The invention may comprise any combination of the features and/or limitations referred to herein, except combinations of such features as are mutually exclusive.

Embodiments of the present invention will now be described, by way of example, with reference to the accompanying drawings, in which.

DESCRIPTION OF THE INVENTION

Figure 1:
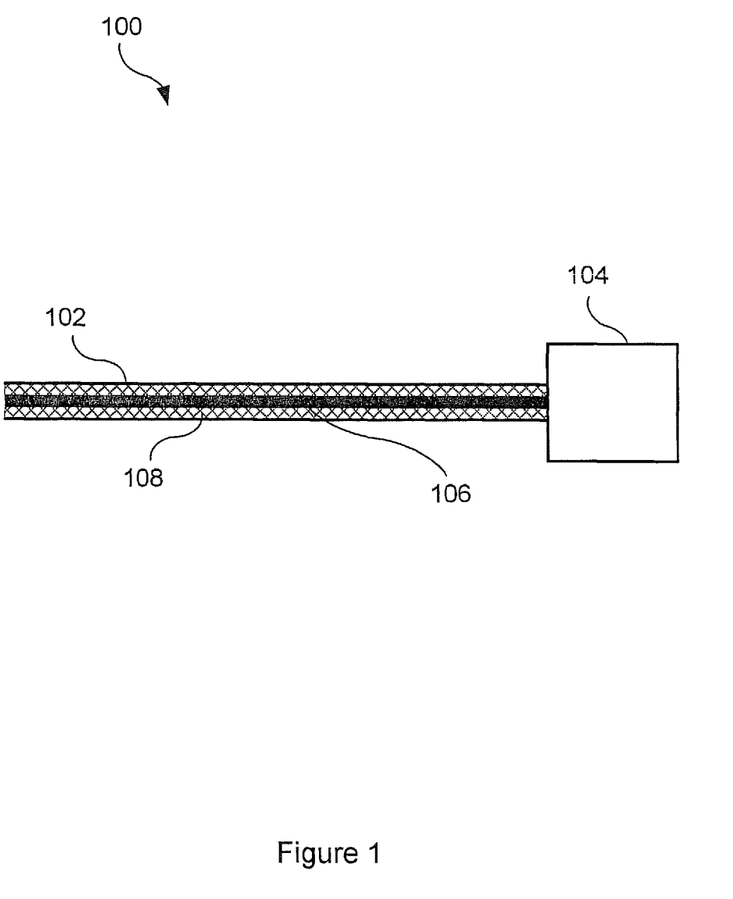
FIG. 1 schematically shows an apparatus for detecting magnetic fields using distributed sensing.

An optical fibre with a magnetostrictive coating can be used to detect magnetic fields. Such a distributed sensing system 100 is shown in FIG. 1. A fibre optic cable 102 is connected to an interrogator/processor unit 104. Interrogator 104 injects light into the fibre optic 102 and senses the light backscattered from along the length of the fibre optic 102. The particular form of the input light and the sampling/processing capability of the interrogator 104 enables simultaneous output of multiple data channels, each channel corresponding to measurement data of disturbances sensed along a particular section of the fibre optic 102. A suitable distributed sensing interrogator is described in GB2442745 for example, the content of which is hereby incorporated by reference. GB2442745 describes a distributed acoustic sensor wherein each sensing portion of the fibre acts as an acoustic sensor for any disturbances due to incident acoustic waves, i.e. pressure waves. In general however the system is responsive to any suitably intense mechanical disturbance or strain. The same general interrogation technique is used to provide distributed magnetic sensing.

While the interrogator 104 is shown in FIG. 1 as a single unit, the hardware may be divided into multiple units. For example, it may be divided into an interrogator box providing output data indicative of the intensity of backscattered light that may then be provided to a separate processor to provide the processing capability. The interrogator or processor may include a sampler that is arranged to sample a plurality of data channels corresponding to detected backscatter from different portions of the optical fibre substantially simultaneously to provide measurement data from a plurality of sensing portions of said fibre (which may be, but do not have to be, contiguous) at each of a plurality of times. The processor may also include a data analyser adapted to process the measurement data to detect events related to a change or disturbance in the ambient magnetic field properties and output parameters associated with the detected events.

As can be seen in FIG. 1, fibre optic cable 102 comprises an optical fibre 106 in contact with a material 108. In this example fibre optic 102 is arranged with optical fibre 106 as a core with a coating of material 108 that exhibits magnetostrictive properties. The optical fibre 106 is therefore mechanically coupled to the magnetostrictive material 108. The dimensions of the magnetostrictive material 108 at a point along the fibre optic may therefore depend on the strength of any magnetic field applied at that point, i.e. the ambient magnetic field. A change in the ambient magnetic field at a particular point along fibre optic 102, which may be tens of kilometers long, will result in a change in the dimensions of the coating 108 in that region. This in turn causes localised changes in the properties of the fibre optic 102, which can be detected due to changes in the backscatter during distributed sensing. In one embodiment the change in strain causes a change in optical path length which can be detected as a phase modulation in the backscatter interference signal.

Therefore, by providing optical fibre 106 with coating 108, the effect of magnetic fields can be detected continuously along the length of the optic fibre 102. The system 100 of FIG. 1 is able to detect localised magnetic fields along its whole length, which may be tens of kilometers. Also, as the system is able to split the optical fibre into a number of discrete sections, the location of an incident magnetic field can be detected.

The key material component required to make the optical fibre sensitive to magnetic field is a material with magnetostrictive properties. Examples of such a material would be iron, nickel, cobalt (the magnetostrictive elements) or more sensitive alloys designed for their magnetostrictive properties such as Terfenol-D. A method of putting this fibre sensitiser as a coating onto an optical fibre is described below.

As mentioned, magnetostrictive materials change dimension in the presence of a magnetic field and if magnetostrictive materials are mechanically coupled to an optical fibre, this strain can be transferred to the fibre, and subsequently detected. Experiments have shown that the magnetostrictive material can be applied as a coating to the fibre in the form of a powder set in a flexible binder matrix. This has significant benefits for manufacture.

The powder may be coated onto the fibre by mixing with an air curing binder then drawing the fibre through the mixture, and on through a defined aperture. This coating method can be applied to large scale manufacturing techniques.

An existing method for coating optical fibres with an acrylate protective film is to draw the fibre though the binder which is in liquid form, then cure the liquid with UV. Several layers of coating with different properties are usually applied.

The powder coating method may make a suspension of magnetostrictive powder in the UV curable liquid before coating using the usual procedure. It is clear that many variables such as coating thickness, curing time, powder loading etc will need to be optimised for magnetic properties as well as production rates, depending on the type of magnetostrictive powder used. Pre-existing coating equipment can be usable for this coating technique, resulting in low production costs.

Some types of magnetostrictive powder have asymmetrical magnetostrictive properties. Alignment of the powder can be carried out with a desired magnetic field being applied prior/during the curing of the binder to fix the powder orientation in the most appropriate direction for maximum sensitivity.

Once coated, an additional protective layer may or may not be needed, but essentially all the usual fibre processing methods should still be applicable.

When in use, the apparatus of FIG. 1 will be able to detect any disturbance in magnetic fields along the length of the fibre, which may be up tens of kilometers in length.

As the apparatus of FIG. 1 can detect disturbances in magnetic fields at positions along the length of the fibre 102, the apparatus can be used in a security portal system to detect the magnetic fields generated by metallic objects passing through the portal, or at least the effect of the metallic object on the ambient magnetic field.

Figure 2:
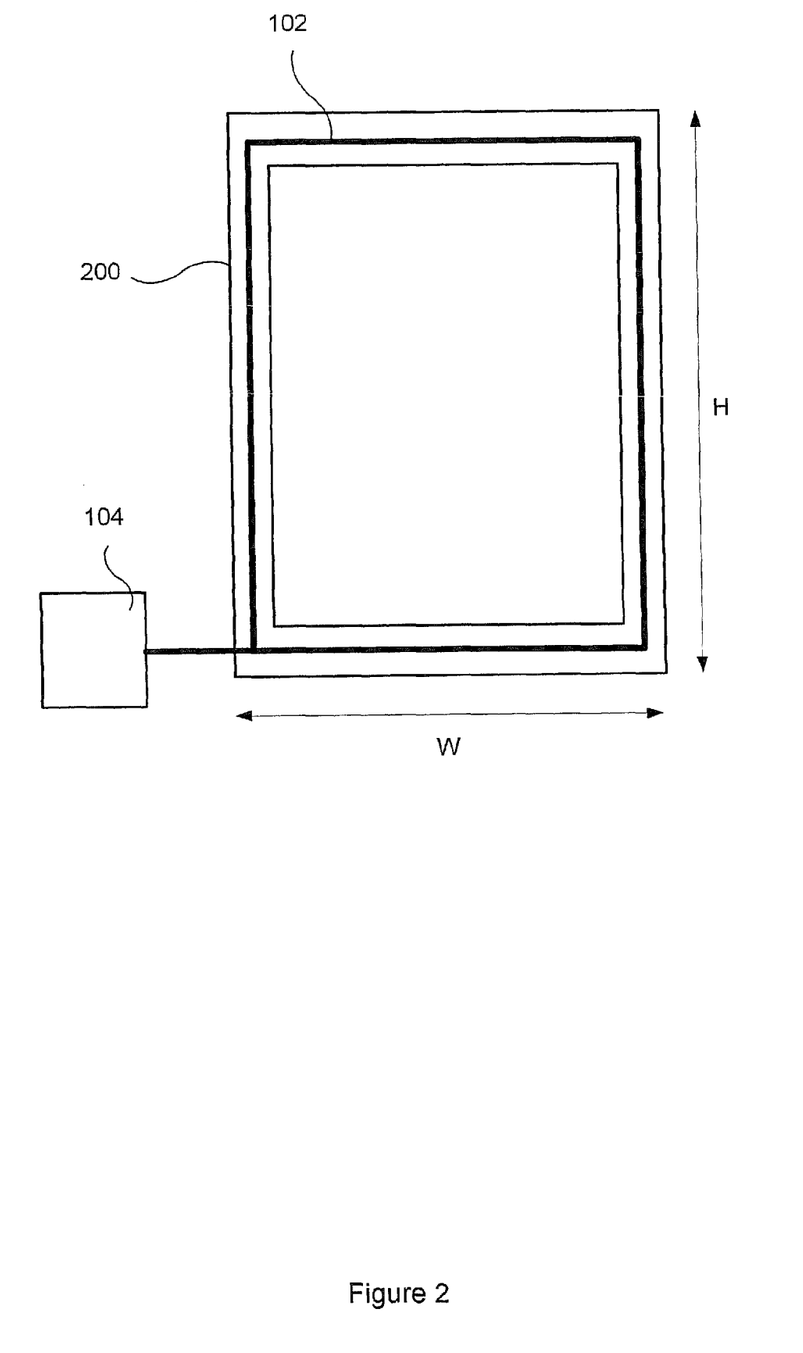
FIG. 2 schematically shows a cross section of a portal monitoring system using the apparatus of FIG. 1.

FIG. 2 schematically shows a cross section of a portal monitoring system using the apparatus of FIG. 1. As shown in FIG. 2, fibre optic 102, comprising optical fibre 106 coated with a material that contains magnetostrictive elements, is provided within a portal 200. The fibre optic 102 is coupled to an interrogator 104 as in FIG. 1. The fibre optic 102 may be up to 40 km in length, and may be wrapped many times around portal (not shown).

Embodiments of the invention may utilise the Earth's magnetic field to detect metallic objects as a person passes through the portal. The magnetic field of the Earth induces magnetic fields in metallic objects and these induced magnetic fields can be detected by the fibre optic 102, due to the coating on the fibre that contains magnetostrictive elements, as described above.

Therefore, as a person carrying a metallic object passes through the portal, the magnetic field induced in the object by the Earth's magnetic field will interact with the magnetostrictive elements in the coating of the optic fibre 102, causing strain to be induced in the fibre 102. By interrogating the fibre as described above, these strains, and hence the metallic objet can be detected. In the absence of a metallic object the ambient magnetic field, which will be due to the earth's magnetic field and any other sources of a permanent magnetic field will be relatively constant—and thus the effect on the magnetostrictive material of the fibre optic will also be constant. Thus there will be no significant variation in the detected signal due to magnetic disturbances. However as a metallic object passes through the portal the magnetic field strength will vary and this disturbance may be detected.

It will be appreciated that they may well be other sources of vibration/strain acting on the fibre optic 102 in the portal, for instance the fibre will be sensitive to acoustic disturbances. These disturbances may cause strain in the fibre 102 and could cause false alarms. To cancel signals not related to changing magnetic fields, a control optical fibre could be used that is made with identical coating and metal loading within the coating, but that the metal used is non-magnetostrictive (for example copper which has a similar density and is inexpensive and readily available). This fibre could then be run close to the magnetically sensitised cable along the same path so that the signals detected by the control fibre can be subtracted from the signals detected from the sensing fibre loaded with the magnetostrictive material. It will be appreciated that the control fibre should be deployed so that it receives the same acoustic signals from the environment as the magnetically sensitised fibre but arranged so as to be isolated from the effects of any change in dimension of the magnetostrictive material.

The signal subtraction could be done in a number of ways. For example, two interrogator units could be used, one for each cable type. Alternatively, one interrogator unit could be used to interrogate both fibres, e.g. by alternately interrogating the sensitised fibre and the non-sensitised (i.e. control) fibre. Also, a single interrogator could be used with the sensitised fibre optically coupled in series with the non-sensitised fibre at the distal end, so that a single interrogation pulse will provide data from both the sensitised fibre and the non-sensitised fibre. Connecting two fibres will result in some loss at the connection which could potentially be avoided by manufacturing a single fibre with a first portion having a magnetostrictive coating and a second portion having a coating of similar properties but not magnetically sensitive. In either case however the maximum length of the sensing fibre/fibre portion will be reduced compared to the use of two fibres which are interrogated separately.

Alternatively, the signals in the fibre 102 that are created as a result of acoustic disturbances may be filtered out using electronic circuitry or other suitable means.

For applications in personnel screening the portal 200 may be dimensioned such that it allows the transit of only a single person through at a time. In other words, the height H may be such that it provides sufficient headroom for people to pass, for example around 2 m or more and the width W may be such that it provides sufficient width for one person to pass, for example around 1 m or more. In this configuration, as a single individual is monitored at a time it may be sufficient to detect the presence of a magnetic object only. The portal may be relatively short in length, for instance less than half a meter or so in length L (not shown in FIG. 2). In this configuration, the portal monitoring system would work in much the same way as a conventional metal detector and could be used to monitor a single person at a time. A length of half a meter or so would still allow for multiple windings of optical fibre around the portal however thus ensuring that multiple sensing portions of optical fibre are able to detect the magnetic field disturbance.

Figure 3:
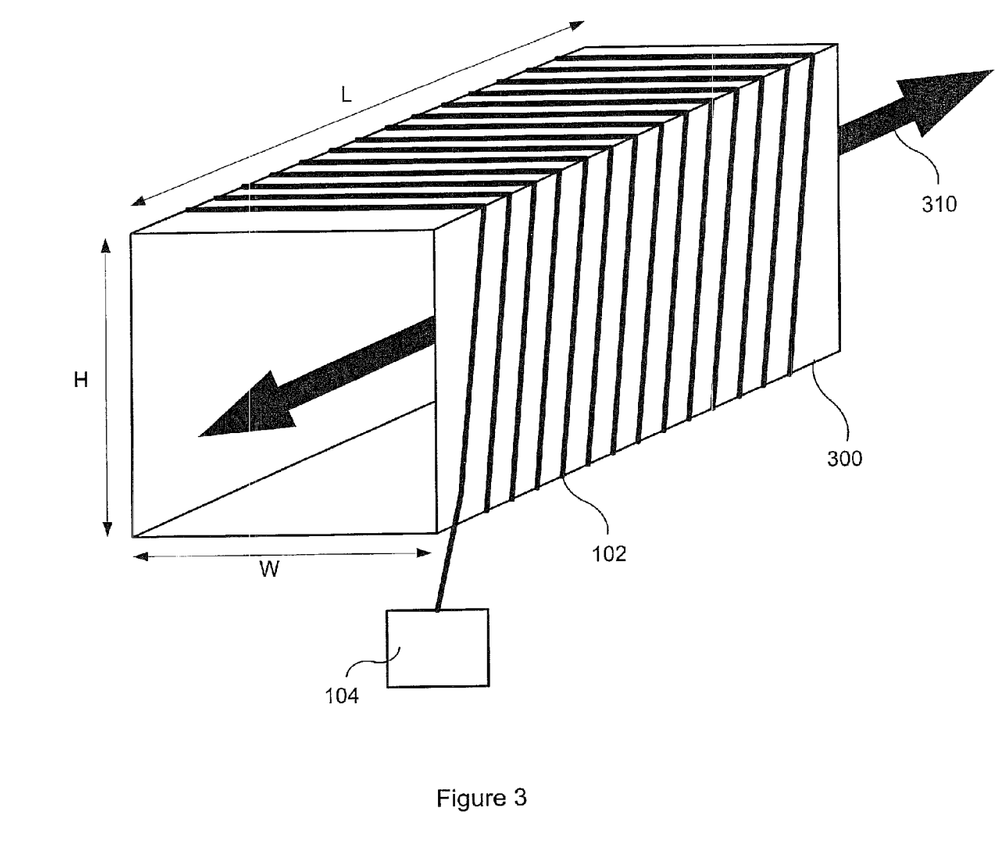
FIG. 3 schematically shows an alternate view of the arrangement of FIG. 2.

Alternatively, the portal could be configured to monitor the transit of many people at a single time. FIG. 3 schematically shows an embodiment in which the portal is able to accommodate more than one person passing through the portal at a time. In FIG. 3, the fibre optic 102 is coiled around a portal 300 of length L, which may be 2 meters or more. When monitoring multiple people or objects at the same time a relatively longer length may be useful to allow movement of an object to be tracked along the length of the portal. In one embodiment, the length L of the portal 300 is 5 meters or more. People or objects to be scanned pass through portal 300 in the direction of the arrow 310. Again the height H of the portal may be such that it provides sufficient headroom for people to pass, for example around 2 m or more, and in this instance the width W may be such that it provides sufficient width for more than one person to transit at the same time, side by side.

In one embodiment, the optical fibre is provided around the periphery a corridor in a building, thereby turning a corridor into a portal. The fibre optic may be installed around a corridor during the constructions phase of a building, or the optic fibre may be retrofitted to a corridor by wrapping the optical fibre around false walls, floor and ceiling. The corridor may be of any size such that multiple turns of the optical fibre can be wrapped along the length.

As the fibre optic 102 is wrapped along the length L of the portal, a person walking through the portal carrying a metallic object will induce strain (as described above) in different sections of the fibre 102 as they move along the portal 300. This allows a metallic object to be tracked along the length L of the portal. The ability to track the movement of a metallic object makes it possible for a plurality of people to be monitored at the same time, as the movement of the detected signal can be matched to the movement of particular people.

Also, as the optical fibre is wrapped around the width W of the portal (the ceiling and floor), if two or more people are walking side by side along the portal, it will be possible to identify the person carrying a metallic object due to the location of the object determined by the strains induced in fibre 102.

In particular, with knowledge of the winding arrangement of the fibre optic the detection of signals induced in several sections of the fibre can be used to detect or estimate the location of an object. For example consider that a portal is 2 m tall by 4 m wide and the length of the individual sensing portion of optical fibre are controlled to be 2 m long. By carefully choosing the longitudinal sections of fibre (which may be done by calibrating the system when first installed, for instance by applying an intense stimulus at the start of a desired sensing portion) the sensor may therefore be arranged to have one sensing portion running generally vertically along each side wall and two sensing portions running across the top of the ceiling/under the floor. If the optical fibre is even just 10 km long this allow over 800 windings of the fibre around the portal. Thus a metallic object within the portal would lead to a disturbance which would be most strongly detected in the winding nearest to the object and most likely with the most intense signals being detected in those sensing portions nearest to object. Thus if the object is in a carrier bag being carried by a person walking on the left hand side of the corridor the most intense signals may be expected in the left hand underfloor sensing portion and the left hand side wall sensing portion.

The signals from distributed fibre optic sensing system could also be analysed together with imaging analysis from a video camera operating in the visible and/or infrared regions to track the movement or people in the corridor and/or pressure sensors under the floor to detect footfalls and/or any other type of sensor used to track the movement of people. By correlating the results of the fibre optic based magnetic sensor with the results from other tracking technologies the individual carrying the object may be identified.

This particular embodiment is advantageous as it allows people in transit though a corridor to be monitored for the presence of metal. This not only allows many people to be scanned with the scanner in a particular time, but it also allows scans to be performed without the knowledge of the people being scanned, which may be desirable for preliminary scans at airports and the like.

Note that the embodiments have described the optical fibre as being wound around the portal but at least part of the optical fibre may run along the length of the portal. For instance part of the optical fibre could be arranged to run along the length of the portal (i.e. under the floor, along a side wall or above the ceiling) and then looped back to run back along the length of the portal.

The fibre may also be arranged so that a longitudinal sensing portion of a given length, say 10 m for example, has a different effective spatial resolution within the portal. Thus the fibre could be arranged with 10 m loop back and forth in a 2 m distance in the portal say. Thus imagine that the portal side wall is 2 m tall but that the fibre optic sensor is arranged such the length of the sensing portions is 10 m. If fibre was simply coiled around the portal then a 10 m section could, for example cover the side wall, the ceiling and at least part of the other side wall. This may be sufficient in some embodiments when all that is required is a location along the portal. However if discrimination within the cross section of the portal is required the fibre could be arranged so that a 10 m section is looped back and forth vertically in the side wall. Thus the whole sensing portion will correspond to the side wall, an effective resolution of about 2 m.

The portal monitoring system of FIGS. 2 and 3 is described as being a passive monitoring system, where the distributed sensing is sensitive enough to detect the magnetic fields in metallic objects induced by the Earth's magnetic field. Alternatively, a separate magnetic field generator such a coil (not shown) could be used to periodically or constantly generate a magnetic field in the vicinity of the portal in order to induce a magnetic field in metallic objects that are to be detected. The coil may be provided integral to, or external to the portal, but should be positioned such that a magnetic field is induced in metallic objects passing through the portal. If a separate coil is used to generate a magnetic field, this field would need to be taken into account when analysing the data from the optical fibre.

The portal may be installed within a corridor in a building, with the optic fibre running around the walls, ceiling and floor of the corridor. Also, the portal may be a free standing portal such that it can be located in a large expanse of space such as an airport departure lounge.

Although FIGS. 2 and 3 show the optic fibre 102 being located around the entire periphery of the portal, it should be understood that the optic fibre may be positioned along only one, two or three sides of the portal. In other words the optical fibre could be deployed to run back and forward above the ceiling of the portal only, or along one side wall and the ceiling. Further, although the portal is shown as a rectangular portal, it should be understood that given the flexible nature of the optic fibre, the portal could be of any shape, in particular an arch shape or vaulted shape.

Whilst endeavouring in the foregoing specification to draw attention to draw attention to those features of the invention believed to be of particular importance, it should be understood that the applicant claims protection in respect of any patentable feature or combination of features hereinbefore referred to and/or shown in the drawings whether or not particular emphasis has been placed thereon.

The invention claimed is:

1. A monitoring system for detecting the presence of metallic objects passing through a portal, comprising:
   a first length of optical fibre mechanically coupled to a material whose physical characteristics vary dependent on an ambient magnetic field, the optical fibre being arranged in the vicinity of the portal being monitored, wherein the portal defines a passage through which people and/or objects may pass and wherein the first length of optical fibre is deployed along at least two sides of the passage defined by the portal;
   a fibre optic interrogator configured to provide distributed sensing on the optical fibre to provide measurement data from each of a plurality of sensing portions of said optical fibre at each of a plurality of times; and
   a data analyser configured to process said measurement data to detect signals characteristic of a disturbance in the magnetic field along the optical fibre so as to detect the presence of a metallic object.

2. A system according to claim 1, wherein the optical fibre is coiled around the portal.

3. A system according to claim 1, wherein the portal has a length of 2 meters or more.

4. A system according to claim 3, wherein the portal defines a corridor.

5. A system according to claim 3, wherein the optical fibre is coiled along the length of the portal.

6. A system according to claim 5, wherein the data analyzer is arranged to determine the location of a detected disturbance of magnetic field along the optical fibre.

7. A system according to claim 6, wherein the data analyzer is arranged to monitor the location of a detected disturbance of magnetic field as it moves along the portal.

8. A system according to claim 1, further comprising:
   a magnetic field generator arranged to generate a magnetic field in the vicinity of the portal.

9. A system according to claim 8, wherein the data analyzer is arranged to compensate for signals associated with the generated magnetic field.

10. A system according to claim 8, wherein the generated magnetic field is (i) a constant magnetic field or (ii) a time varying magnetic field.

11. A system according to claim 1, further comprising a second length of optical fibre deployed along the same path as the first length of optical fibre, wherein the second length of optical fibre is insensitive to changes in magnetic field and a fibre optic interrogator arranged to interrogate said second length of optical fibre to detect any acoustic signals affecting the second length of optical fibre.

12. A system according to claim 11 wherein the fibre optic interrogator used to interrogate the second length of optical fibre is the same fibre optic interrogator used to interrogate the first length of optical fibre.

13. A system according to claim 11, wherein the data analyser is arranged to process the detected signals from the second length of optical fibre to compensate for any acoustic signals affecting the first optical fibre.

14. A system according to claim 1, wherein the first length of optical fibre and interrogator of the first length of optical fibre are arranged such that a longitudinal sensing portion of the first length of optical fibre is provided along at least a first side of the portal.

15. A system according to claim 14, wherein longitudinal sensing portions are provided along at least one side wall of the portal and also along the base and/or ceiling of the portal.

16. A system according to claim 14, wherein longitudinal sensing portions are provided along both side walls of the portal and along the floor and ceiling of the portal.

17. A system according to claim 16, wherein multiple windings of the first length of optical fibre are provided around the portal such that multiple longitudinal sensing portions are provided along each side of the portal.

18. A system according to claim 17, wherein the longitudinal sensing portion on each side of the portal are spaced apart and extend along the length of the portal.

19. A system according to claim 15, wherein the data analyser is arrange to determine a location signal characteristic of a disturbance in magnetic field along the optical fibre, based on the characteristics of the signals from the longitudinal sensing portions.

20. A system according to claim 1, wherein the portal is arranged (i) along a corridor of a building or (ii) to be a free standing portal.

21. A method of monitoring a portal defining a passage through which people and/or objects pass so as to detect the presence of metallic objects, the method comprising:
   interrogating an optical fibre, which is mechanically coupled to a material whose physical characteristics vary dependent on the ambient magnetic field, with pulses of electromagnetic radiation to provide a distributed sensor having a plurality of sensing portions of optical fibre, said optical fibre being arranged along at least two sides of the passage defined by the portal, and
   analysing the signals from each of said plurality of sensing portions of optical fibre to detect signals characteristic of a disturbance in the magnetic field in the portal so as to detect the presence of a metallic object.

22. A method according to claim 21, wherein the optical fibre is arranged such that a longitudinal sensing portion of the optical fibre is provided along at least a first side of the portal, the method further comprising determining a location signal characteristic of a disturbance in magnetic field along the optical fibre, based on the characteristics of the signals from the longitudinal sensing portions.

23. A method according to claim 22, further comprising monitoring the location of a detected disturbance in magnetic field as it moves along the portal.

24. A method according to claim 22, further comprising generating a magnetic field in the vicinity of the portal.

25. A method according to claim 21 further comprising interrogating a second length of optical fibre to detect any acoustic signals affecting the second length of optical fibre, said second length of optical fibre being deployed along the same path as the first length of optical fibre, wherein the second length of optical fibre is insensitive to changes in magnetic field.

26. A method according to claim 21, wherein the portal is arranged along a corridor of a building, wherein the optical fibre is (i) installed during the construction of the corridor or (ii) retrofitted to the corridor.

* * * * *